(12) United States Patent
Huang (10) Patent No.: US 9,620,572 B2
(45) Date of Patent: Apr. 11, 2017

(54) OLED DISPLAY PANEL, METHOD FOR MANUFACTURING THE SAME AND DISPLAY DEVICE

(71) Applicant: BOE TECHNOLOGY GROUP CO., LTD., Beijing (CN)

(72) Inventor: Wei Huang, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 147 days.

(21) Appl. No.: 14/413,380

(22) PCT Filed: Jun. 17, 2014

(86) PCT No.: PCT/CN2014/080045
§ 371 (c)(1),
(2) Date: Jan. 7, 2015

(87) PCT Pub. No.: WO2015/043238
PCT Pub. Date: Apr. 2, 2015

(65) Prior Publication Data
US 2016/0276417 A1    Sep. 22, 2016

(30) Foreign Application Priority Data
Sep. 29, 2013    (CN) .......................... 2013 1 0454569

(51) Int. Cl.
*G02F 1/1333*    (2006.01)
*H01L 27/32*     (2006.01)
*H01L 29/786*    (2006.01)

(52) U.S. Cl.
CPC ........ *H01L 27/3246* (2013.01); *H01L 27/322* (2013.01); *H01L 27/3258* (2013.01);
(Continued)

(58) Field of Classification Search
CPC ............. H01L 27/3246; H01L 27/3258; H01L 27/322; H01L 29/7869; H01L 2227/323; H01L 2251/5346
See application file for complete search history.

(56) References Cited

U.S. PATENT DOCUMENTS

| | | | |
|---|---|---|---|
| 2005/0122447 A1 | 6/2005 | Shiota et al. | |
| 2006/0152151 A1* | 7/2006 | Seo ....................... | H01L 27/322 313/506 |

(Continued)

FOREIGN PATENT DOCUMENTS

| | | |
|---|---|---|
| CN | 1289151 A | 3/2001 |
| CN | 1722923 A | 1/2006 |

(Continued)

OTHER PUBLICATIONS

Text of the Notification of the First Office Action issued in corresponding Chinese Application No. 2013104545690 dated Jun. 4, 2015.

(Continued)

*Primary Examiner* — Tracie Y Green
(74) *Attorney, Agent, or Firm* — BakerHostetler LLP (57) ABSTRACT

Disclosed are OLED display panel and method for manufacturing the same, as well as display device including the OLED display panel. The present disclosure belongs to the field of an organic light emitting diode. The OLED display panel includes a light emitting structure, a TFT backplane, and an insulating layer. The insulating layer locates between the light emitting structure and the TFT backplane. A refractive index of the insulating layer gradually decreases in a direction of an emergent ray of the light emitting structure. The technical solution of the present disclosure may decrease influences of the emergent ray of the light emitting structure on TFT performance.

18 Claims, 7 Drawing Sheets

(52) U.S. Cl.
CPC .... *H01L 29/7869* (2013.01); *H01L 2227/323* (2013.01); *H01L 2251/5346* (2013.01)

(56) References Cited

U.S. PATENT DOCUMENTS

| | | |
|---|---|---|
| 2012/0267633 A1 | 10/2012 | Hayashi et al. |
| 2012/0319100 A1 | 12/2012 | Yoshioka et al. |
| 2013/0001578 A1 | 1/2013 | Song et al. |
| 2013/0154949 A1 | 6/2013 | Jamshidi et al. |

FOREIGN PATENT DOCUMENTS

| | | |
|---|---|---|
| CN | 1787226 | 6/2006 |
| CN | 1921142 | 2/2007 |
| CN | 103280516 | 9/2013 |
| CN | 103500754 | 1/2014 |
| CN | 203466195 | 3/2014 |
| JP | 2002091339 | 3/2002 |

OTHER PUBLICATIONS

International Search Report and Written Opinion issued in corresponding International Application No. PCT/CN2014/080045 dated Sep. 19, 2014.

Office Action in Chinese Patent Application No. 201310454569.0, dated Jul. 7, 2016.

\* cited by examiner

Prior Art

OLED DISPLAY PANEL, METHOD FOR MANUFACTURING THE SAME AND DISPLAY DEVICE

CROSS-REFERENCE TO RELATED APPLICATION

This application is the U.S. national phase of PCT Application No. PCT/CN2014/080045 filed on Jun. 17, 2014, which claims priority to Chinese Patent Application No. 201310454569.0 filed on Sep. 29, 2013, the disclosures of which are incorporated in their entirety by reference herein.

TECHNICAL FIELD

The present disclosure relates to the field of an organic light emitting diode, in particular to an OLED display panel and a method for manufacturing the same, as well as a display device including the OLED display panel.

BACKGROUND

An organic light emitting diode (OLED) has advantages of rapid response, gorgeous color, being light and convenient, broad work scope, and so on. The OLED has been a new star in display industry. As low temperature poly-silicon (LTPS), commonly-used in current OLED display panel, has disadvantages of complicated process, expensive cost, difficulties in being large-sized, thus a backplane of metallic oxide TFT (metallic oxide thin film transistor) has been an important direction focused by OLED research and manufacture.

Figure 1:
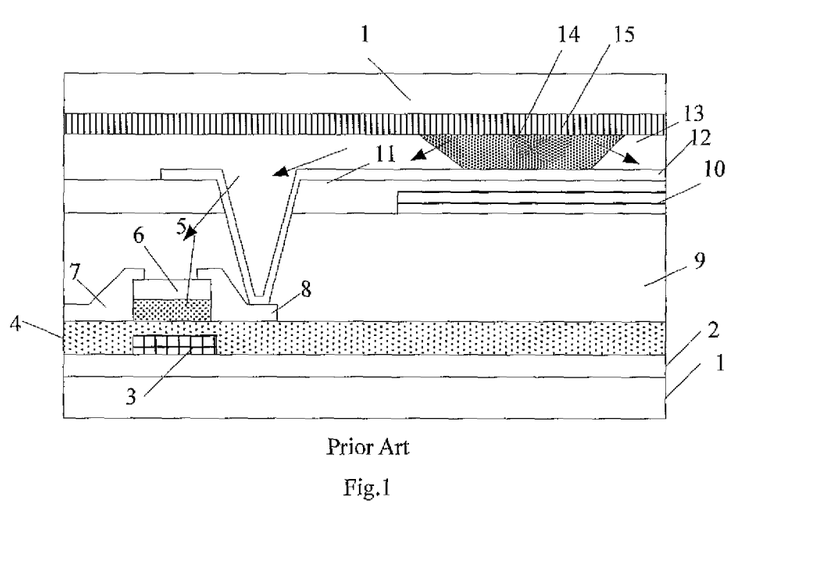
FIG. 1 is a schematic view of a bottom emitting OLED display panel.

Although the metallic oxide TFT has an excellent performance with a simple manufacturing process and being easy to be large-sized, the metallic oxide TFT has a poor photostability, which has long perplexed manufacturers. Currently, there is still no method for properly solving the photo-stability of the metallic oxide TFT in the OLED display panel. Particularly, in a bottom emitting OLED display panel as shown in FIG. 1, a light-ray (shown as arrows), generated by an electroluminescence of an organic light emitting layer 14, will directly irradiate or reflect to a thin film transistor (TFT) structure unavoidably, an incident visible-light generates a negative influence on performances of the thin film transistor (TFT), such as output/transfer capacity and reliability, the shorter wavelength of the incident visible-light, the more significant of a drift of the thin film transistor (TFT), and at the same time, a smaller switch ratio and an increasing current of drain electrode directly influence a display performance of a display product.

SUMMARY OF THE INVENTION

An object of the present disclosure is to provide an OLED display panel and a method for manufacturing the same, as well as a display device including the display panel, the design of the OLED display panel may decrease influences of an emergent ray of a light emitting structure on performances of the TFT backplane in the OLED display panel.

To solve the above technical problem, the present disclosure provides technical solutions as below:

The present disclosure provides an OLED display panel. The OLED display panel includes a light emitting structure, a TFT backplane, and an insulating layer located between the light emitting structure and the TFT backplane; wherein in a direction of an emergent ray of the light emitting structure, a refractive index of the insulating layer gradually decreases.

In an embodiment of the present disclosure, the light emitting structure is a bottom light emitting structure, the insulating layer is a pixel defining layer of the OLED display panel, and in a direction from a cathode to an anode of the light emitting structure, a refractive index of the pixel defining layer gradually decreases.

In an embodiment of the present disclosure, the pixel defining layer consists of one or more resin materials with one single photosensitive group and one or more resin materials with a plurality of photosensitive groups. A refractive index of the resin materials with the plurality of photosensitive groups is higher than that of the resin materials having one single photosensitive group. In the direction from the cathode to the anode of the light emitting structure, a concentration of the resin materials with the plurality of photosensitive groups gradually decreases in the pixel defining layer.

In an embodiment of the present disclosure, the pixel defining layer has a refractive index between 1.4 and 2.0.

In an embodiment of the present disclosure, the OLED display panel includes:
  a first substrate;
  a TFT formed on the first substrate, wherein the TFT includes a source electrode, a drain electrode and a gate electrode;
  a passivation layer formed on the TFT, wherein the passivation layer includes a via hole of the passivation layer;
  a color filter unit formed on the passivation layer;
  a protection layer formed on the color filter unit, wherein the protection layer includes a via hole of the protection layer corresponding to the via hole of the passivation layer;
  an anode of the light emitting structure formed on the protection layer, wherein the anode is connected to the drain electrode of the TFT through the via hole of the passivation layer and the via hole of the protection layer;
  a pattern of the pixel defining layer formed on the anode, and an organic light emitting layer of the light emitting structure located between adjacent pixel defining layers;
  a cathode of the light emitting structure formed on the pixel defining layer and the organic light emitting layer.

The present disclosure further provides a display device, including the above OLED display panel.

The present disclosure further provides a method for manufacturing an OLED display panel including a light emitting structure and a TFT backplane; the method includes: forming an insulating layer located between the light emitting structure and the TFT backplane, wherein in a direction of an emergent ray of the light emitting structure, a refractive index of the insulating layer gradually decreases.

In an embodiment of the present disclosure, the light emitting structure is a bottom light emitting structure, a process of forming the insulating layer located between the light emitting structure and the TFT backplane further includes:
  forming a pixel defining layer of the OLED display panel, wherein in a direction from a cathode to an anode of the light emitting structure, a refractive index of the pixel defining layer gradually decreases.

In an embodiment of the present disclosure, a process of forming the pixel defining layer of the OLED display panel further includes:

forming a mixture solution on a substrate provided with the anode, to form a mixture solution thin film, wherein the mixture solution includes one or more resin materials having one single photosensitive group, one or more resin materials with a plurality of photosensitive groups and a light-absorbing material being capable of absorbing an ultraviolet-light and a visible-light with a wavelength shorter than a predetermined value, and wherein a refractive index of the resin materials with the plurality of photosensitive groups is higher than that of the resin materials having one single photosensitive group;

subjecting the mixture solution thin film to exposure and forming a pattern of the pixel defining layer consisting of the mixture solution thin film by a patterning process; and curing the pattern of the pixel defining layer to form the pixel defining layer, wherein in the direction from the cathode to the anode of the light emitting structure, a concentration of the resin materials with the plurality of photosensitive groups gradually decreases in the pixel defining layer.

In an embodiment of the present disclosure, the method of manufacturing the OLED display panel specifically includes:

providing a first substrate;

forming a TFT on the first substrate, wherein the TFT includes a source electrode, a drain electrode and a gate electrode;

forming a passivation layer on the TFT, wherein the passivation layer includes a via hole of the passivation layer;

forming a color filter unit on the passivation layer;

forming a protection layer on the color filter unit, wherein the protection layer includes a via hole of the protection layer corresponding to the via hole of the passivation layer;

forming an anode of the light emitting structure on the protection layer, wherein the anode is connected to the drain electrode of the TFT through the via hole of the passivation layer and the via hole of the protection layer;

forming a pattern of the pixel defining layer on the anode, and forming an organic light emitting layer of the light emitting structure located between adjacent pixel defining layers; and forming a cathode of the light emitting structure on the pixel defining layer and the organic light emitting layer.

The present disclosure has following advantages:

In the above technical solutions, in the direction of the emergent ray of the light emitting structure, the refractive index of the insulating layer located between the light emitting structure and the TFT backplane gradually decreases. Thus, after the emergent ray of the light emitting structure enters into the insulating layer, a refraction angle gradually increases, so that most of the emergent rays may bypass the TFT and then the light-rays irradiating to the TFT reduces, thereby decreasing influences of the emergent ray of the light emitting structure on TFT performance.

BRIEF DESCRIPTION OF THE DRAWINGS

FIG. 2 is a diagram showing an influence of an incident visible-light on a current of a drain electrode in a TFT; in FIG. 2, X coordinate represents a voltage of a gate electrode, Y coordinate represents a current of a drain electrode.

FIG. 3 is a diagram showing an influence of an incident visible-light on a voltage of a gate electrode in a TFT; in FIG. 3, X coordinate represents a voltage of a gate electrode, Y coordinate represents a current of a drain electrode.

FIG. 4 is a diagram showing an influence of an incident visible-light on a voltage of a gate electrode in a TFT; in FIG. 4, X coordinate represents a voltage of a gate electrode, Y coordinate represents a current of a drain electrode.

DETAILED DESCRIPTION

To make the objects, the technical solutions and the advantages of the present disclosure more apparent, detailed description will be made combining with drawings and specific embodiments below. Following embodiments are used to illustrate the present disclosure, but not to limit the scope of the present disclosure.

The present embodiment directs to a problem that an emergent ray of a light emitting structure will influence performances of metallic oxide TFT backplane in the existing OLED display panel using a metallic oxide TFT backplane, and provide an OLED display panel and a method for manufacturing the same, as well as a display device including the OLED display panel. The OLED display panel may decrease influences of the emergent ray of the light emitting structure on TFT performance.

Embodiments of the present disclosure provide an OLED display panel, the OLED display panel includes a light emitting structure, a TFT backplane, and an insulating layer located between the light emitting structure and the TFT backplane, wherein, in a direction of an emergent ray of the light emitting structure, a refractive index of the insulating layer gradually decreases.

In the OLED display panel of the present disclosure, in the direction of the emergent ray of the light emitting structure, the refractive index of the insulating layer, located between the light emitting structure and the TFT backplane, gradually decreases. Thus, after the emergent ray of the light emitting structure enters into the insulating layer, a refraction angle gradually increases, so that most of the emergent rays may bypass the TFT, which reduces the light-rays irradiating to the TFT, so as to decrease influences of the emergent ray of the light emitting structure on TFT performance.

In details, the light emitting structure may be a bottom light emitting structure. The insulating layer is a pixel defining layer of the OLED display panel. In a direction from a cathode to an anode of the light emitting structure, a refractive index of the pixel defining layer gradually decreases. Thus, after the emergent ray of the light emitting structure enters into the insulating layer, a refraction angle gradually increases, so that most of the emergent rays may bypass the TFT, which reduces the light-rays irradiating to the TFT, so as to decrease influences of the emergent ray of the light emitting structure on TFT performance.

To achieve the refractive index of the pixel defining layer having a gradual change, in an embodiment of the present disclosure, the pixel defining layer consists of one or more resin materials with one single photosensitive group and one or more resin materials with a plurality of photosensitive groups. A refractive index of the resin materials with the plurality of photosensitive groups is higher than a refractive index of the resin materials with one single photosensitive group. In the direction from the cathode to the anode of the light emitting structure, a concentration of the resin materials with the plurality of photosensitive groups gradually decreases in the pixel defining layer, so that the top part of the pixel defining layer may have a relative higher refractive index, and the refractive index gradually decreases from the top part to the bottom part. The pixel defining layer has a refractive index between 1.4 and 2.0. In an embodiment of the present disclosure, the pixel defining layer has a refractive index between 1.5 and 1.8.

In an embodiment of the present disclosure, the OLED display panel includes:

a first substrate;

a TFT formed on the first substrate, wherein the TFT includes a source electrode, a drain electrode and a gate electrode;

a passivation layer formed on the TFT, wherein the passivation layer includes a via hole of the passivation layer;

a color filter unit formed on the passivation layer;

a protection layer formed on the color filter unit, wherein the protection layer includes a via hole of the protection layer corresponding to the via hole of the passivation layer;

an anode of the light emitting structure formed on the protection layer, wherein the anode is connected to the drain electrode of the TFT through the via hole of the passivation layer and the via hole of the protection layer;

a pattern of the pixel defining layer formed on the anode, and an organic light emitting layer of the light emitting structure located between adjacent pixel defining layers; and a cathode of the light emitting structure formed on the pixel defining layer and the organic light emitting layer.

In an embodiment of the present disclosure, the OLED display panel further includes a second substrate formed on the cathode.

Embodiments of the present disclosure further provide a display device, including the above OLED display panel. The structure of the OLED display panel and the operating principle thereof are same as those of the above embodiments, which are omitted for brevity herein. Besides, structures of other parts of the display device may refer to prior art, which is not described in details herein. Such display device may be any products or components having a display function, such as a television, a displayer, a digital photo frame, a mobile phone, a tablet PC.

Embodiments of the present disclosure further provide a method for manufacturing the above OLED display panel. The OLED display panel includes a light emitting structure and a TFT backplane. The method for manufacturing the OLED display panel includes: forming an insulating layer located between the light emitting structure and the TFT backplane, wherein in a direction of an emergent ray of the light emitting structure, a refractive index of the insulating layer gradually decreases.

The OLED display panel manufactured by the present disclosure, in the direction of the emergent ray of the light emitting structure thereof, the refractive index of the insulating layer located between the light emitting structure and the TFT backplane gradually decreases. Thus, after the emergent ray of the light emitting structure enters into the insulating layer, a refraction angle gradually increases, so that most of the emergent rays may bypass the TFT, which reduces the light-rays irradiating to the TFT, so as to decrease influences of the emergent ray of the light emitting structure on TFT performance.

In an embodiment of the present disclosure, the light emitting structure is a bottom light emitting structure, the forming the insulating layer located between the light emitting structure and the TFT backplane further includes:

forming a pixel defining layer of the OLED display panel, wherein, in a direction from a cathode to an anode of the light emitting structure, a refractive index of the pixel defining layer gradually decreases. Thus, after the emergent ray of the light emitting structure enters into the insulating layer, a refraction angle gradually increases, so that most of the emergent rays may bypass the TFT, which reduces the light-rays irradiating to the TFT, so as to decrease influences of the emergent ray of the light emitting structure on TFT performance.

In an embodiment of the present disclosure, the forming the pixel defining layer of the OLED display panel further includes:

forming a mixture solution on a substrate provided with the anode to form a mixture solution thin film, wherein the mixture solution includes one or more resin materials with one single photosensitive group, one or more resin materials with a plurality of photosensitive groups and a light-absorbing material being capable of absorbing an ultraviolet-light and a visible-light with a wavelength shorter than a predetermined value; and a refractive index of the resin materials with the plurality of photosensitive groups is higher than a refractive index of the resin materials having one single photosensitive group;

subjecting the mixture solution thin film to exposure, and forming a pattern of the pixel defining layer consisting of the mixture solution thin film by a patterning process;

curing the pattern of the pixel defining layer to form the pixel defining layer, wherein, in the direction from the cathode to the anode of the light emitting structure, a concentration of the resin materials with the plurality of photosensitive groups gradually decreases in the pixel defining layer.

Figure 5:
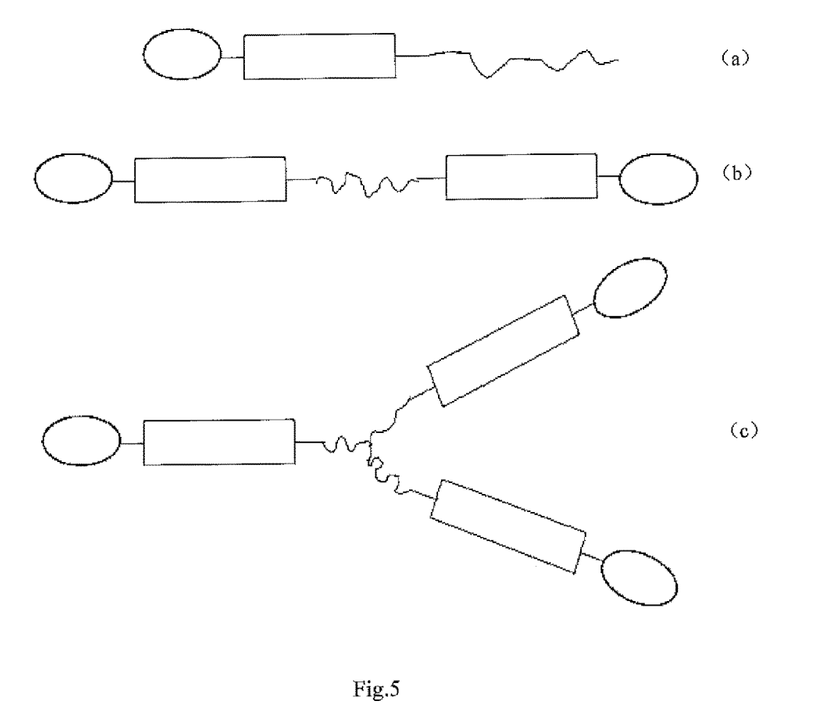
FIG. 5 is a schematic view showing a resin material with one single photosensitive group and a resin material with a plurality of photosensitive groups.

In the above steps, a dye or a pigment, which may absorb an ultraviolet-light or a visible-light with a relative shorter wavelength, may be incorporated into a photosensitive organic resin to form a mixture solution. The dye and the pigment is required to have an excellent property for absorbing the ultraviolet-light or the visible-light with the relative shorter wavelength, and have a relatively homogeneous dispersion effect in the photosensitive organic resin. As shown in FIG. 5, the photosensitive organic resin is formed by well mixing at a certain ratio (for example 1:1) one or more resin materials with one single photosensitive group (having a lower refractive index, shown as FIG. 5(a)) and one or more resin materials with a plurality of photosensitive group (having a higher refractive index, and as shown in FIGS. 5(b) and (c)), without a phenomenon of phase separation occurring.

The mixture solution thin film formed of the mixture solution is subjected to exposure. During the exposure, due to the light-absorbing effect of the dye and the pigment, a light intensity of the bottom part of the mixture solution thin film is weaker than that of the top part of the mixture solution thin film, thereby a regional distribution of the light intensity generates in a straight direction of the mixture solution thin film, in which the light intensity of the mixture solution thin film gradually decrease from top to bottom. During the exposure, the resin materials with the plurality of the photosensitive groups have a faster reaction rate, and consumed much faster in the top part of the mixture solution thin film, which causes that the resin materials with the plurality of the photosensitivity groups in the bottom part of the mixture solution thin film concentration-migrating to the top part of the mixture solution thin film. Therefore, in the mixture solution thin film after exposure, a regional distribution is formed, in which the resin materials with the plurality of the photosensitive groups mainly locates at the top part of the mixture solution thin film and the resin materials with one single photosensitive group mainly locates at the bottom part of the mixture solution thin film. Then, a pattern of the pixel defining layer consisting of the mixture solution thin film is solidified to form the pixel defining layer. As the refractive index of the resin materials with the plurality of the photosensitive groups is higher than that of the resin materials with one single photosensitive group, the refractive index of the pixel defining layer having a regional distribution from top to bottom is obtained.

In details, the method for manufacturing the OLED display panel includes:
providing a first substrate;
forming a TFT on the first substrate, wherein the TFT includes a source electrode, a drain electrode and a gate electrode;
forming a passivation layer on the TFT, wherein the passivation layer includes a via hole of the passivation layer;
forming a color filter unit on the passivation layer;
forming a protection layer on the color filter unit, wherein the protection layer includes a via hole of the protection layer corresponding to the via hole of the passivation layer;
forming an anode of the light emitting structure on the protection layer, wherein the anode is connected to the drain electrode of the TFT through the via hole of the passivation layer and the via hole of the protection layer;
forming a pattern of the pixel defining layer on the anode, and forming an organic light emitting layer of the light emitting structure located between adjacent pixel defining layers; and
forming a cathode of the light emitting structure on the pixel defining layer and the organic light emitting layer.

Figure 2:
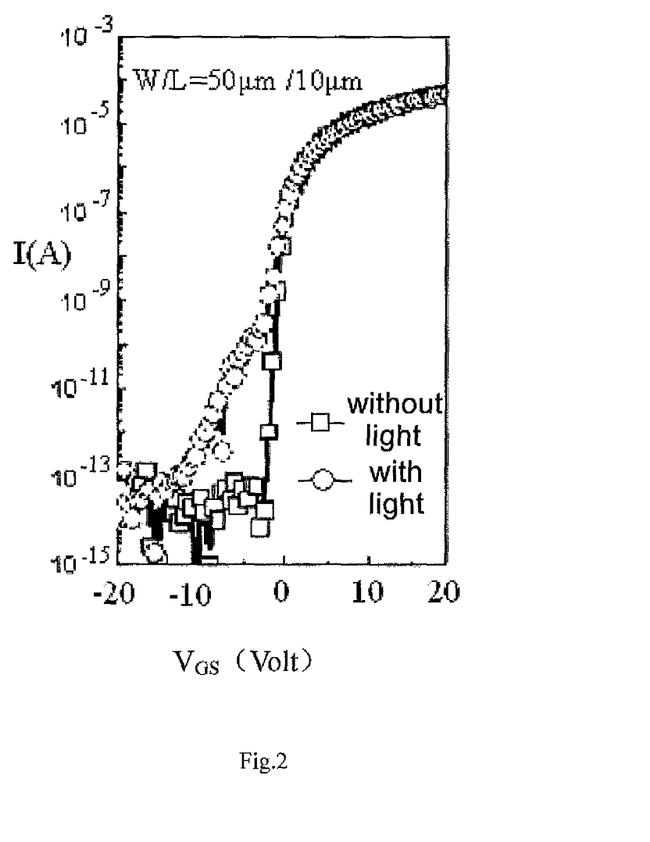
Figure 3:
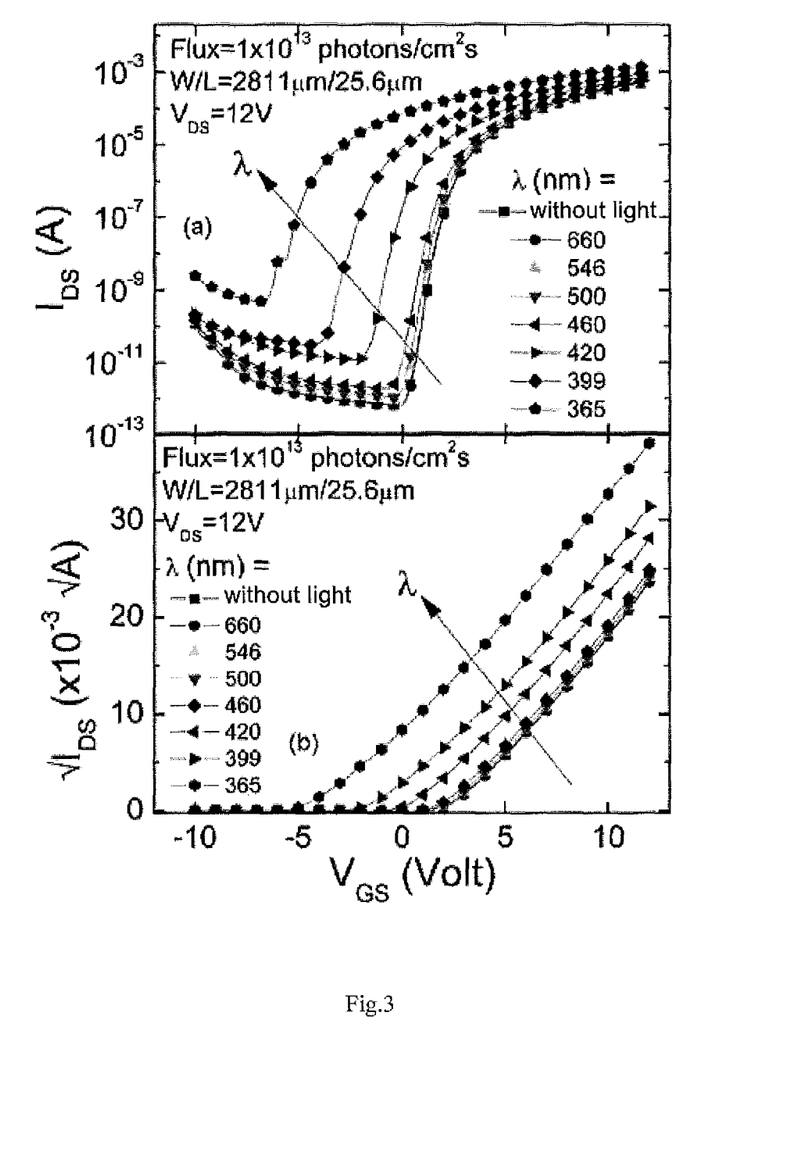
Figure 4:
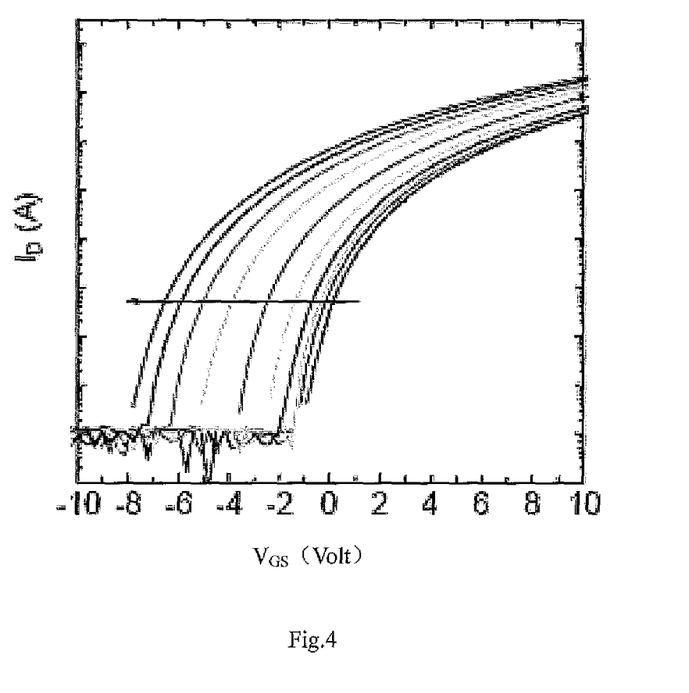

Detailed descriptions with the OLED display panel of the present disclosure and the method for manufacturing the same will be made below combining with drawings and specific embodiments:

Various factors such as different channel width-length ratios, different wavelengths of the incident visible-light and different positive/negative bias voltage, will generate adverse effects on TFT performances such as output/transfer ability and reliability, and thus directly influence product performances. Taking an incident visible-light as an example, the shorter wavelength of the incident visible-light, the more significant of a drift of the TFT, with a smaller switch ratio and an increasing current of a drain electrode. Therefore, for those OLED display panels using the metallic oxide TFT backplane, the emergent ray of the light emitting structure will influence the TFT performance. Taking a TFT with a channel width-length ratio being 50 μm/10 μm as an example, as shown in FIG. 2, it can be seen that an incident visible-light will increase a current of a drain electrode of the TFT. In FIG. 2, X coordinate represents a voltage of a gate electrode, and Y coordinate represents a current of a drain electrode. Taking a TFT with a channel width-length ratio being 2811 μm/25.6 μm as an example, as shown in FIG. 3, it can be seen that an incident visible-light will make a voltage of a gate electrode of a TFT negatively-drifting, and the shorter wavelength of the incident, the larger influence on TFT performance. In FIG. 3, X coordinate represents a voltage of a gate electrode, and Y coordinate represents a current of a drain electrode. FIG. 4 shows an influence of one same incident ray on a voltage of a gate electrode in a TFT. In FIG. 4, X coordinate represents a voltage of a gate electrode, and Y coordinate represents a current of a drain electrode; and from right to left, an irradiating period of the incident ray successively increases. It can be seen from an example in FIG. 4 that the incident visible-light will make a voltage of a gate electrode of a TFT negatively-drifting, and the longer irradiating period of the incident visible-light, the larger influence on TFT performance.

Figure 6:
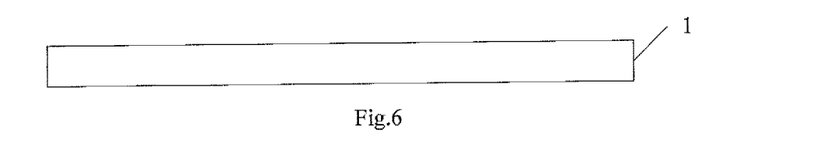
FIG. 6 is a schematic view showing a cross-section of a substrate according to embodiments of the present disclosure.

In order to decrease the influence of the incident visible-light on TFT performance, the present disclosure provides an OLED display panel and a method for manufacturing the same. As shown in FIG. 6 to FIG. 17, the method for manufacturing the OLED display panel includes following steps:

Step a: as shown in FIG. 6, a substrate 1 is provided, wherein the substrate 1 is a glass substrate or a quartz substrate.

Figure 7:
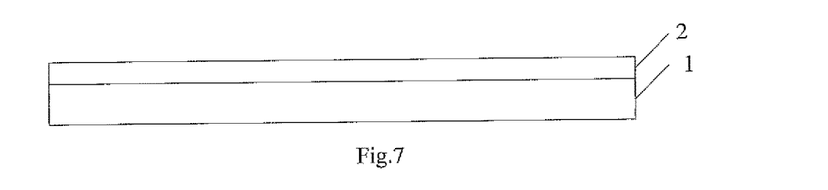
FIG. 7 is a schematic view showing a cross-section of a substrate after a buffer layer is formed thereon according to embodiments of the present disclosure.

Step b: as shown in FIG. 7, a buffer layer 2 is formed on the substrate 1.

In an embodiment of the present disclosure, the buffer layer 2 is deposited on the substrate 1 using a plasma enhanced chemical vapor deposition (PECVD) method; wherein, a material of the buffer layer 2 may be selected from oxide, nitride or oxynitride, and the buffer layer 2 has a single-layer structure, a double-layer structure or a multi-layer structure. In another embodiment of the present disclosure, the buffer layer 2 is $SiN_x$, $SiO_x$ or $Si(ON)_x$.

Figure 8:
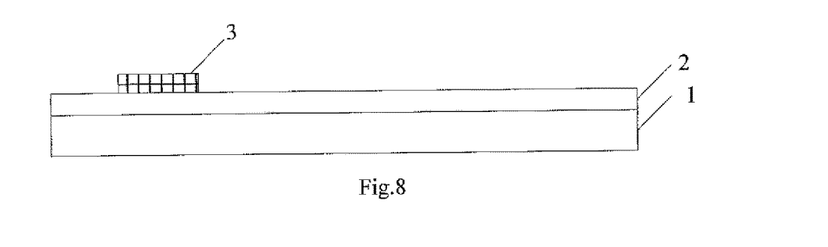
FIG. 8 is a schematic view showing a cross-section of a substrate after a gate electrode is formed on a buffer layer according to embodiments of the present disclosure.

Step c: as shown in FIG. 8, a pattern of a gate electrode 3 and a gate line is formed on the buffer layer 2.

In an embodiment of the present disclosure, a gate metallic layer having a thickness of 2500 Å to 16000 Å is deposited on the buffer layer 2 using a sputtering method or a thermal evaporation method. Such gate metallic layer may be metals such as Cu, Al, Ag, Mo, Cr, Nd, Ni, Mn, Ti, Ta and W, and an alloy of these metals. Such gate metallic layer may be a single-layer structure or a multi-layer structure; wherein the multi-layer structure may be Cu\Mo, Ti\Cu\Ti, Mo\Al\Mo, and so on. After being coated on the gate metallic layer, a layer of the photoresist is subjected to exposure using a mask, so that a photoresist-unremained area and a photoresist-remained area are formed in the photoresist layer. In which, the photoresist-remained area corresponds to an area where the pattern of gate electrode 3 and gate line locates, and the photoresist-unremained area corresponds to an area outside the above pattern. After the exposure, the photoresist in the photoresist-unremained area is totally removed, while a thickness of the photoresist in the photoresist-remained area remains unchanged. A gate metallic thin film in the photoresist-unremained area is totally removed by an etching process, after stripping off residual photoresist, the pattern of gate line and gate electrode 3 is formed.

Figure 9:
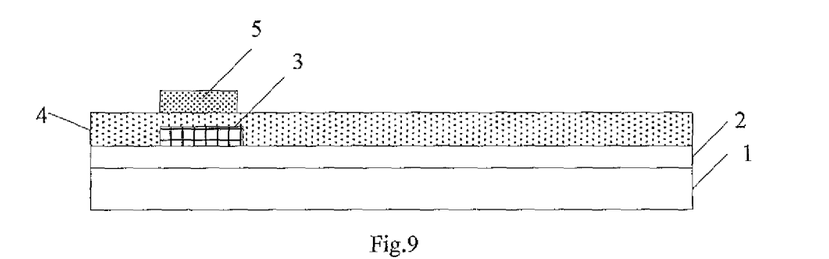
FIG. 9 is a schematic view showing a cross-section of a substrate after a gate insulating layer and an active layer are formed on a buffer layer provided with a gate electrode according to embodiments of the present disclosure.

Step d: as shown in FIG. 9, a pattern of a gate insulating layer 4 and a pattern of an active layer 5 are successively formed on the substrate after the Step c.

In an embodiment of the present disclosure, a gate insulating layer 4 having a thickness of about 2000 Å to about 6000 Å may be deposited on the substrate 1 after the Step c using the plasma enhanced chemical vapor deposition method. A material of the gate insulating layer may be selected from oxide, nitride or oxynitride; the gate insulating layer may be a single-layer structure, a double-layer structure or a multi-layer structure. Specifically, the gate insulating layer may be $SiN_x$, $SiO_x$ or $Si(ON)_x$.

Then, a semiconductor layer having a thickness of about 20 Å to about 1000 Å is deposited on the gate insulating layer 4 using a magnetron sputtering method, a thermal evaporation method or other film-formation methods. After being coated on the semiconductor layer, a layer of photoresist is subjected to exposure and developing. After etching the semiconductor and stripping off the photoresist, the pattern of the active layer 5 consists of the semiconductor layer is formed.

Figure 10:
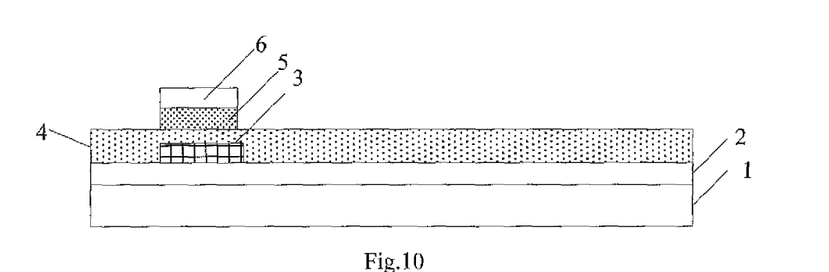
FIG. 10 is a schematic view showing a cross-section of a substrate after an etch stopping layer is formed on an active layer according to embodiments of the present disclosure.

Step e: as shown in FIG. 10, an etch stopping layer 6 is formed on the active layer 5.

In an embodiment of the present disclosure, the etch stopping layer 6 may be deposited on the substrate after the Step d using the plasma enhanced chemical vapor deposition method. After being coated on the etching stopping layer, a layer of photoresist is subjected to exposure and developing. Then after etching the etching stopping layer and stripping off the photoresist, a pattern of the etching stopping layer 6 is formed. A material of the etching stopping layer may be selected from oxide, nitride or oxynitride; and the etching stopping layer may be a single-layer structure, a double-layer structure or a multi-layer structure. Specifically, the gate insulating layer may be $SiN_x$, $SiO_x$ or $Si(ON)_x$.

Figure 11:
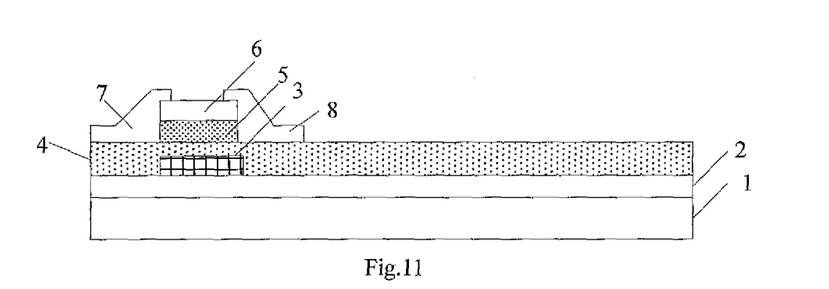
FIG. 11 is a schematic view showing a cross-section of a substrate after a source electrode and a drain electrode are formed thereon according to embodiments of the present disclosure.

Step f: as shown in FIG. 11, a pattern of source electrode 7, drain electrode 8 and data line is formed on the substrate after the Step e.

In an embodiment of the present disclosure, a source-drain metallic layer having a thickness of about 2000 Å to about 6000 Å is deposited on the substrate 1 after the Step e using a magnetron sputtering method, a thermal evaporation method or other film-formation methods. Such source-drain metallic layer may be metals such as Cu, Al, Ag, Mo, Cr, Nd, Ni, Mn, Ti, Ta and W, and an alloy of these metals. The source-drain metallic layer may be a single-layer structure or a multi-layer structure; and the multi-layer structure may be Cu\Mo, Ti\Cu\Ti, Mo\Al\Mo, and so on. A layer of photoresist is coated on the source-drain metallic layer. The layer of photoresist is then subjected to exposure using a mask, so that a photoresist-unremained area and a photoresist-remained area are formed in the photoresist layer, wherein, the photoresist-remained area corresponds to an area where the pattern of source electrode, drain electrode and data line locates, and the photoresist-unremained area corresponds to an area outside the above pattern. After the exposure, the photoresist in the photoresist-unremained area is totally removed, while a thickness of the photoresist in the photoresist-remained area remains unchanged. A source-drain metallic thin film in the photoresist-unremained area is totally removed by an etching process, after stripping off residual photoresist, the pattern of data line, source electrode 7 and drain electrode 8 is formed.

Figure 12:
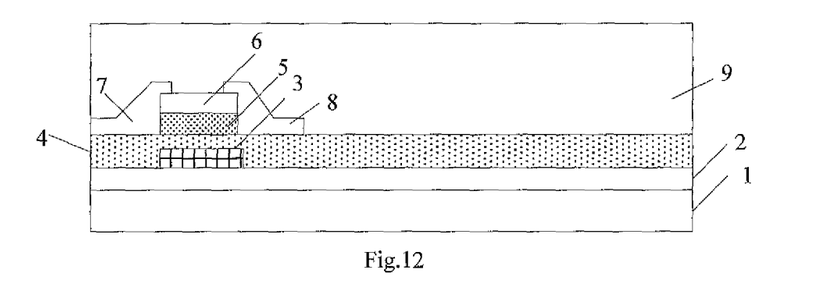
FIG. 12 is a schematic view showing a cross-section of a substrate after a passivation layer is formed thereon according to embodiments of the present disclosure.

Step g: as shown in FIG. 12, a passivation layer 9 is formed on the substrate after the Step f.

In an embodiment of the present disclosure, a passivation layer 9 having a thickness of 400 Å to 5000 Å is deposited on the substrate 1 after the Step f using a magnetron sputtering method, a thermal evaporation method, a PECVD method or other film-formation methods. A material of the passivation layer may be selected from oxide, nitride or oxynitride. In an embodiment of the present disclosure, the passivation layer may be $SiN_x$, $SiO_x$ or $Si(ON)_x$. In an embodiment of the present disclosure, the passivation layer may be a single-layer structure. In another embodiment of the present disclosure, the passivation layer may be a double-layer structure consisting of silicon nitride and silicon oxide.

Figure 13:
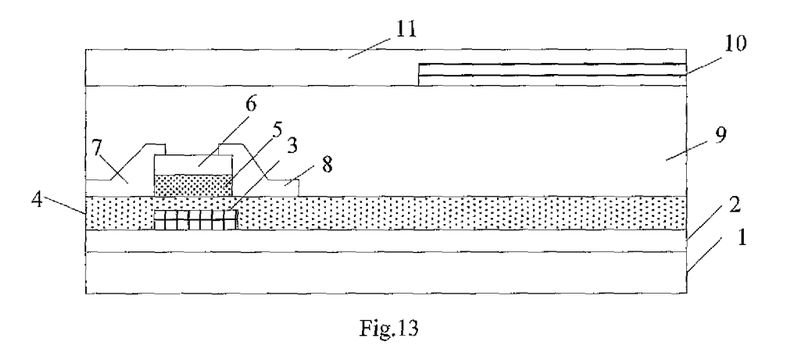
FIG. 13 is a schematic view showing a cross-section of a substrate after a color filter unit and a protection layer are formed thereon according to embodiments of the present disclosure.

Step h: as shown in FIG. 13, a color filter unit 10 and a protection layer 11 are formed on the passivation layer 9.

In an embodiment of the present disclosure, a color filter unit 10, including a red filter subunit, a green filter subunit and a blue filter subunit, is formed on the passivation layer 9. And a protection layer 11 is deposited on the color filter unit 10 using a magnetron sputtering method, a thermal evaporation method a PECVD method or other film-formation methods. A material of the protection layer may be selected from oxide, nitride or oxynitride. In an embodiment of the present disclosure, the protection layer may be $SiN_x$, $SiO_x$ or $Si(ON)_x$. The protection layer may be a single-layer structure, or a double-layer structure.

Figure 14:
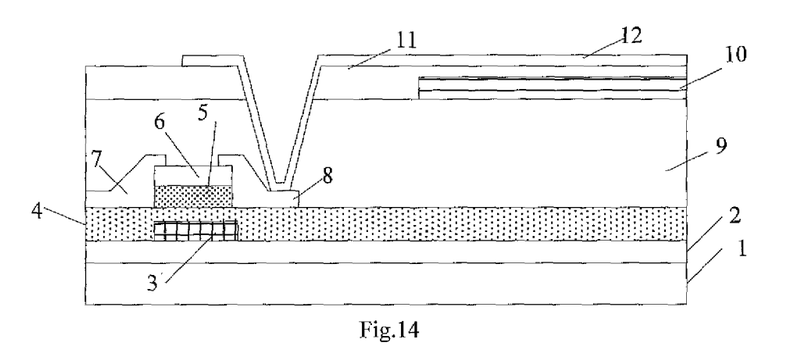
FIG. 14 is a schematic view showing a cross-section of a substrate after a transparent conduction layer is formed thereon.

Step i: as shown in FIG. 14, an anode 12 of the light emitting structure consisting of a transparent conduction layer is formed on the protection layer 11.

In an embodiment of the present disclosure, firstly, a via hole of the passivation layer is formed in the passivation layer 9 by a patterning process, a via hole of the protection layer is formed in the protection layer 11, and the via hole of the protection layer corresponds to the via hole of the passivation layer one to one; then a transparent conduction layer having a thickness of 300 Å to 1500 Å is deposited on the protection layer 11 using a magnetron sputtering method, a thermal evaporation method or other film-formation methods. The transparent conduction layer may be ITO or IZO, After being coated on the transparent conduction layer, a layer of photoresist is subjected to exposure using a mask, so that a photoresist-unremained area and a photoresist-remained area are formed in the photoresist layer, wherein, the photoresist-remained area corresponds to an area where the pattern of the anode 12 of the light emitting structure locates, and the photoresist-unremained area corresponds to an area outside the above pattern. The developing treatment is carried out, and then the photoresist in the photoresist-unremained area is totally removed, while a thickness of the photoresist in the photoresist-remained area remains unchanged. The transparent conduction layer in the photoresist-unremained area is totally removed by an etching process, and after stripping away residual photoresist, the anode 12 is formed. The anode 12 electrically connects to the drain electrode 8 through the via hole of the passivation layer and the via hole of the protection layer.

Figure 15:
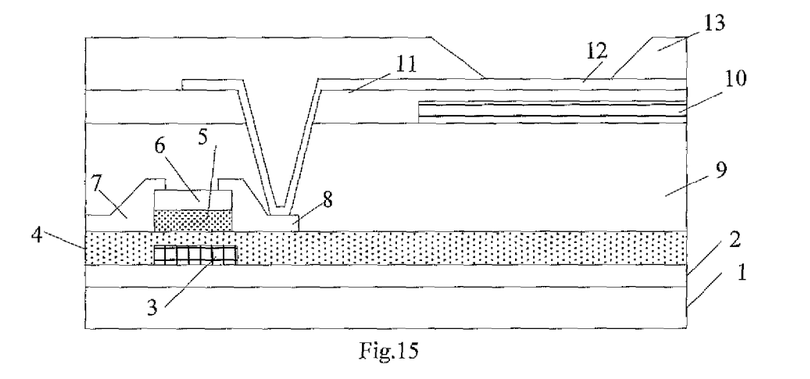
FIG. 15 is a schematic view showing a cross-section of a substrate after a pixel defining layer is formed thereon according to embodiments of the present disclosure.

Step j: as shown in FIG. 15, a pixel defining layer 13 is formed on the substrate after the Step i.

In an embodiment of the present disclosure, a dye or a pigment, which may absorb an ultraviolet-light or a visible-light with a relative shorter wavelength, may be incorporated into a photosensitive organic resin to form a mixture solution. The dye and the pigment is required to have an excellent property for absorbing the ultraviolet-light or the visible-light with the relative shorter wavelength, and have a relatively homogeneous dispersion effect in the photosensitive organic resin. As shown in FIG. 5, the photosensitive organic resin is formed by well mixing at a certain ration (for example 1:1) one or more resin materials with one single photosensitive group (having a lower refractive index) and one or more resin materials with a plurality of photosensitive group (having a higher refractive index), without a phenomenon of phase separation occurring.

A mixture solution is deposited on the substrate after the Step i using a spin-coating method, a scrape-coating method, a transfer-print method or other film-formation methods, to form a mixture solution thin film, having a thickness of 1 μm to 5 μm. In an embodiment of the present disclosure, the mixture solution thin film has a thickness of 1.5 μm to 2.5 μm. Then the mixture solution thin film is subjected to exposure, and during the exposure, due to the light-absorbing effect of the dye and the pigment, a light intensity of the bottom part of the mixture solution thin film is weaker than a light intensity of the top part of the mixture solution thin film, a regional distribution of the light intensity generates in a straight direction of the mixture solution thin film, in which the light intensity of the mixture solution thin film gradually decreases from top to bottom. The resin materials with the plurality of the photosensitive groups have a faster reaction rate, and consumed much faster in the top part of the mixture solution thin film, which causes that the resin materials with the plurality of the photosensitivity groups in the bottom part of the mixture solution thin film concentration-migrating to the top part of the mixture solution thin film. Therefore, in the mixture solution thin film after exposure, a regional distribution is formed, in which the resin materials with the plurality of the photosensitive groups mainly locates at the top part of the mixture solution thin film and the resin materials with one single photosensitive group mainly locates at the bottom part of the mixture solution thin film.

Then, a pattern of the pixel defining layer consisting of the mixture solution thin film is formed by a patterning process, then the pattern of the pixel defining layer is solidified to form the pixel defining layer. As the refractive index of the resin materials with the plurality of the photosensitive groups is higher than that of the resin materials with one single photosensitive group, the refractive index of the pixel defining layer having a regional distribution from top to bottom is obtained, the pixel defining layer has a refractive index between 1.4 and 2.0. In an embodiment of the present disclosure, the pixel defining layer has the refractive index between 1.5 and 1.8.

Figure 16:
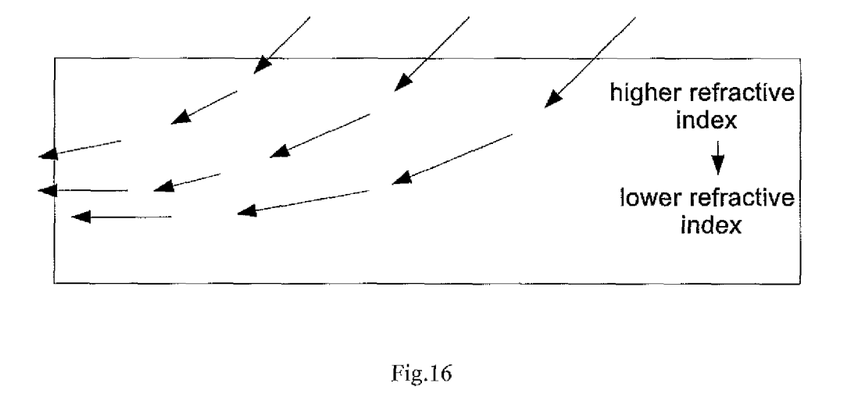
FIG. 16 is a schematic view showing a light propagation in a pixel defining layer according to embodiments of the present disclosure.

As shown in FIG. 16, as a light-ray passes through the pixel defining layer, since a refraction angle becomes bigger when the light-ray enters into a medium with a lower refractive index from a medium with a higher refractive index, and the refractive of the pixel defining layer gradually decreases from top to bottom, the light-ray has a propagating direction shown as the arrow in FIG. 16 in the pixel defining layer.

In addition, in some display panels, the pixel defining layer is called as a stack layer, a process for forming the stack layer is similar with the process of forming the pixel defining layer, which is omitted for brevity herein.

Figure 17:
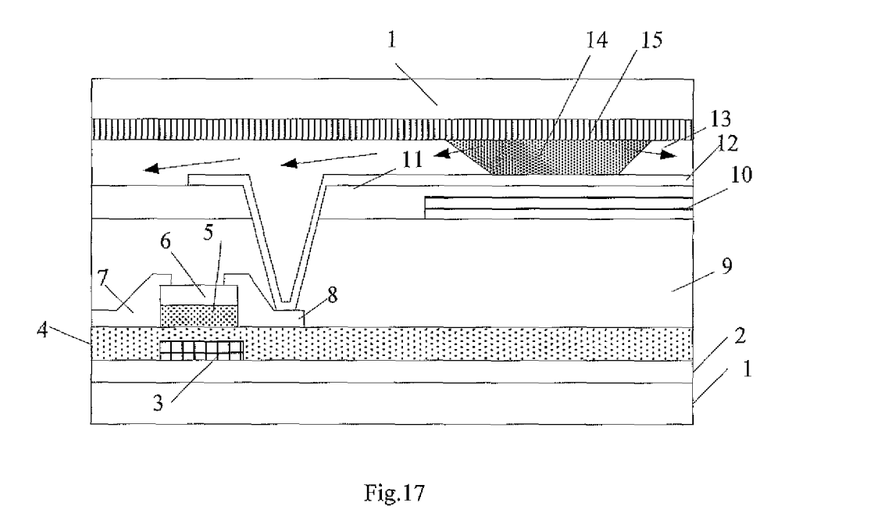
FIG. 17 is a schematic view showing of an OLED display panel according to embodiments of the present disclosure.

Step k: as shown in FIG. 17, an organic light emitting layer 14 is formed between adjacent pixel defining layers 13; an cathode 15 of the light emitting structure is formed on the pixel defining layer 13 and the organic light emitting layer 14; and a substrate 1 is attached on the cathode 15, then the OLED display panel shown as FIG. 17 is obtained.

In an embodiment of the present disclosure, an organic light emitting layer 14, consisting of a hole injection layer, a hole transport layer, an organic light emitting layer, a electron transfer transport layer and an electron injection layer, is formed between adjacent pixel defining layers 13, and the cathode 15 of the light emitting structure is formed on the pixel defining layer 13 and the organic light emitting layer 14. The cathode 15 may be made of Cu, Al, Ag, Mo, Cr, Nd, Ni, Mn, Ti, Ta and W, and an alloy of these metals. After attaching another substrate 1 on the cathode 15, the OLED display shown as FIG. 17 is obtained. As shown in FIG. 17, most of the light-rays passing through the pixel defining layer may bypass the TFT, which reduces the light-rays irradiating to the TFT, so as to decrease influences of the emergent ray of the light emitting structure on TFT performance.

In the present embodiment, adding a dye or a pigment into an organic resin, in which the dye or the pigment may absorb an ultraviolet-light or a visible-light with a relative shorter wavelength, may lead to a regional distribution of the refractive indexes with each resin material in the pixel defining layer. After a light-ray irradiated from the light emitting structure enters into the pixel defining layer, the light-ray undergoes a plurality of refraction processes of interfaces between an optically denser medium and an optically thinner medium, which makes the light-ray deviating from an original path, so as to achieve effective control on transmission path of the light-ray emitted from the light emitting structure, and decrease influences of the light-ray on TFT performance. The method for manufacturing the OLED display panel of the present disclosure has advantages of having simple process and high reliability.

The above are merely representative embodiments of the present disclosure. It should be noted that, a person skilled in the art may further make improvements and modifications without departing from the principle of the present disclosure, and these improvements and modifications shall also be considered as the scope of the present disclosure.

What is claimed is:

1. An OLED display panel, comprising:
a light emitting structure,
a TFT backplane; and
an insulating layer located between the light emitting structure and the TFT backplane,
wherein, in a direction of an emergent ray of the light emitting structure, a refractive index of the insulating layer gradually decreases, the insulating layer consists of one or more resin materials with one single photosensitive group and one or more resin materials with a plurality of photosensitive groups, and a refractive index of the resin materials with the plurality of photosensitive groups is higher than that of the resin materials with one single photosensitive group, wherein in the direction of the emergent ray, a concentration of the resin materials with the plurality of photosensitive groups gradually decreases in the insulating layer.

2. The OLED display panel according to claim 1, wherein the light emitting structure is a bottom light emitting structure, the insulating layer is a pixel defining layer of the OLED display panel, and in a direction from a cathode to an anode of the light emitting structure, a refractive index of the pixel defining layer gradually decreases.

3. The OLED display panel according to claim 2, wherein the pixel defining layer has the refractive index between 1.4 and 2.0.

4. The OLED display panel according to claim 3, wherein the pixel defining layer has the refractive index between 1.5 and 1.8.

5. The OLED display panel according to claim 2, wherein the OLED display panel comprises:
   a first substrate;
   a TFT formed on the first substrate, wherein the TFT comprises a source electrode, a drain electrode and a gate electrode;
   a passivation layer formed on the TFT, wherein the passivation layer comprises a via hole of the passivation layer;
   a color filter unit formed on the passivation layer;
   a protection layer formed on the color filter unit, wherein the protection layer comprises a via hole of the protection layer corresponding to the via hole of the passivation layer;
   an anode of the light emitting structure formed on the protection layer, wherein the anode is connected to the drain electrode of the TFT through the via hole of the passivation layer and the via hole of the protection layer;
   a pattern of the pixel defining layer formed on the anode, and an organic light emitting layer of the light emitting structure located between adjacent pixel defining layers; and
   a cathode of the light emitting structure formed on the pixel defining layer and the organic light emitting layer.

6. The OLED display panel according to claim 2, wherein the OLED display panel comprises:
   a first substrate;
   a TFT formed on the first substrate, wherein the TFT comprises a source electrode, a drain electrode and a gate electrode;
   a passivation layer formed on the TFT, wherein the passivation layer comprises a via hole of the passivation layer;
   a color filter unit formed on the passivation layer;
   a protection layer formed on the color filter unit, wherein the protection layer comprises a via hole of the protection layer corresponding to the via hole of the passivation layer;
   an anode of the light emitting structure formed on the protection layer, wherein the anode is connected to the drain electrode of the TFT through the via hole of the passivation layer and the via hole of the protection layer;
   a pattern of the pixel defining layer formed on the anode, and an organic light emitting layer of the light emitting structure located between adjacent pixel defining layers; and
   a cathode of the light emitting structure formed on the pixel defining layer and the organic light emitting layer.

7. The OLED display panel according to claim 3, wherein the OLED display panel comprises:
   a first substrate;
   a TFT formed on the first substrate, wherein the TFT comprises a source electrode, a drain electrode and a gate electrode;
   a passivation layer formed on the TFT, wherein the passivation layer comprises a via hole of the passivation layer;
   a color filter unit formed on the passivation layer;
   a protection layer formed on the color filter unit, wherein the protection layer comprises a via hole of the protection layer corresponding to the via hole of the passivation layer;
   an anode of the light emitting structure formed on the protection layer, wherein the anode is connected to the drain electrode of the TFT through the via hole of the passivation layer and the via hole of the protection layer;
   a pattern of the pixel defining layer formed on the anode, and an organic light emitting layer of the light emitting structure located between adjacent pixel defining layers; and
   a cathode of the light emitting structure formed on the pixel defining layer and the organic light emitting layer.

8. The OLED display panel according to claim 4, wherein the OLED display panel comprises:
   a first substrate;
   a TFT formed on the first substrate, wherein the TFT comprises a source electrode, a drain electrode and a gate electrode;
   a passivation layer formed on the TFT, wherein the passivation layer comprises a via hole of the passivation layer;
   a color filter unit formed on the passivation layer;
   a protection layer formed on the color filter unit, wherein the protection layer comprises a via hole of the protection layer corresponding to the via hole of the passivation layer;
   an anode of the light emitting structure formed on the protection layer, wherein the anode is connected to the drain electrode of the TFT through the via hole of the passivation layer and the via hole of the protection layer;
   a pattern of the pixel defining layer formed on the anode, and an organic light emitting layer of the light emitting structure located between adjacent pixel defining layers; and
   a cathode of the light emitting structure formed on the pixel defining layer and the organic light emitting layer.

9. A display device, comprising the OLED display panel according to claim 1.

10. The Display device according to claim 9, wherein the light emitting structure is a bottom light emitting structure, the insulating layer is a pixel defining layer of the Display device, and in a direction from a cathode to an anode of the light emitting structure, a refractive index of the pixel defining layer gradually decreases.

11. The Display device according to claim 10, wherein the pixel defining layer has the refractive index between 1.4 and 2.0.

12. The Display device according to claim 11, wherein the pixel defining layer has the refractive index between 1.5 and 1.8.

13. The Display device according to claim 10, wherein the OLED display panel comprises:
- a first substrate;
- a TFT formed on the first substrate, wherein the TFT comprises a source electrode, a drain electrode and a gate electrode;
- a passivation layer formed on the TFT, wherein the passivation layer comprises a via hole of the passivation layer;
- a color filter unit formed on the passivation layer;
- a protection layer formed on the color filter unit, wherein the protection layer comprises a via hole of the protection layer corresponding to the via hole of the passivation layer;
- an anode of the light emitting structure formed on the protection layer, wherein the anode is connected to the drain electrode of the TFT through the via hole of the passivation layer and the via hole of the protection layer;
- a pattern of the pixel defining layer formed on the anode, and an organic light emitting layer of the light emitting structure located between adjacent pixel defining layers; and
- a cathode of the light emitting structure formed on the pixel defining layer and the organic light emitting layer.

14. A method for manufacturing OLED display panel comprising a light emitting structure and a TFT backplane, the method comprises: forming an insulating layer located between the light emitting structure and the TFT backplane, wherein in a direction of an emergent ray of the light emitting structure, a refractive index of the insulating layer gradually decreases, and the insulating layer comprises one or more resin materials with one single photosensitive group and one or more resin materials with a plurality of photosensitive groups, and a refractive index of the resin materials with the plurality of photosensitive groups is higher than that of the resin materials with one single photosensitive group, wherein in the direction of the emergent ray, a concentration of the resin materials with the plurality of photosensitive groups gradually decreases in the insulating layer.

15. The method according to claim 14, wherein the light emitting structure is a bottom light emitting structure, said forming the insulating layer located between the light emitting structure and the TFT backplane further comprises:
- forming a pixel defining layer of the OLED display panel, wherein in a direction from a cathode to an anode of the light emitting structure, a refractive index of the pixel defining layer gradually decreases.

16. The method according to claim 15, wherein said forming the pixel defining layer of the OLED display panel further comprises:
- forming a mixture solution on a substrate provided with the anode to form a mixture solution thin film, wherein the mixture solution comprises the one or more resin materials with one single photosensitive group, the one or more resin materials with a plurality of photosensitive groups and a light-absorbing material being capable of absorbing an ultraviolet-light and a visible-light with a wavelength shorter than a predetermined value;
- subjecting the mixture solution thin film to exposure, and forming a pattern of the pixel defining layer consisting of the mixture solution thin film by a patterning process; and
- curing the pattern of the pixel defining layer to form the pixel defining layer, wherein in the direction from the cathode to the anode of the light emitting structure, a concentration of the resin materials with the plurality of photosensitive groups gradually decreases in the pixel defining layer.

17. The method according to claim 15, comprising:
- providing a first substrate;
- forming a TFT on the first substrate, wherein the TFT comprises a source electrode, a drain electrode and a gate electrode;
- forming a passivation layer on the TFT, wherein the passivation layer comprises a via hole of the passivation layer;
- forming a color filter unit on the passivation layer;
- forming a protection layer on the color filter unit, wherein the protection layer comprises a via hole of the protection layer corresponding to the via hole of the passivation layer;
- forming an anode of the light emitting structure on the protection layer, wherein the anode is connected to the drain electrode of the TFT through the via hole of the passivation layer and the via hole of the protection layer;
- forming a pattern of the pixel defining layer on the anode, and forming an organic light emitting layer of the light emitting structure located between adjacent pixel defining layers; and
- forming a cathode of the light emitting structure on the pixel defining layer and the organic light emitting layer.

18. The method according to claim 16, comprising:
- providing a first substrate;
- forming a TFT on the first substrate, wherein the TFT comprises a source electrode, a drain electrode and a gate electrode;
- forming a passivation layer on the TFT, wherein the passivation layer comprises a via hole of the passivation layer;
- forming a color filter unit on the passivation layer;
- forming a protection layer on the color filter unit, wherein the protection layer comprises a via hole of the protection layer corresponding to the via hole of the passivation layer;
- forming an anode of the light emitting structure on the protection layer, wherein the anode is connected to the drain electrode of the TFT through the via hole of the passivation layer and the via hole of the protection layer;
- forming a pattern of the pixel defining layer on the anode, and forming an organic light emitting layer of the light emitting structure located between adjacent pixel defining layers; and
- forming a cathode of the light emitting structure on the pixel defining layer and the organic light emitting layer.

* * * * *